(12) United States Patent
Ahn et al.

(10) Patent No.: US 9,984,921 B2
(45) Date of Patent: May 29, 2018

(54) SEMICONDUCTOR DEVICE AND METHOD OF MANUFACTURING THE SAME

(71) Applicant: Samsung Electronics Co., Ltd., Suwon-si (KR)

(72) Inventors: Sang Hoon Ahn, Goyang-si (KR); Jong Min Baek, Seoul (KR); Myung Geun Song, Yongin-si (KR); Woo Kyung You, Incheon (KR); Byung Kwon Cho, Suwon-si (KR); Byung Hee Kim, Seoul (KR); Na Ein Lee, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days. days.

(21) Appl. No.: 15/802,724

(22) Filed: Nov. 3, 2017

(65) Prior Publication Data

US 2018/0053685 A1 Feb. 22, 2018

Related U.S. Application Data

(63) Continuation of application No. 15/353,984, filed on Nov. 17, 2016, now Pat. No. 9,812,353.

(30) Foreign Application Priority Data

Dec. 3, 2015 (KR) .................. 10-2015-0171797
Feb. 5, 2016 (KR) .................. 10-2016-0015165

(51) Int. Cl.
*H01L 21/00* (2006.01)
*H01L 21/768* (2006.01)
(Continued)

(52) U.S. Cl.
CPC .... *H01L 21/7682* (2013.01); *H01L 21/31111* (2013.01); *H01L 21/31116* (2013.01);
(Continued)

(58) Field of Classification Search
CPC .......... H01L 21/7685; H01L 21/32053; H01L 21/7682; H01L 21/31144; H01L 21/31111; H01L 21/31116
See application file for complete search history.

(56) References Cited

U.S. PATENT DOCUMENTS 8,034,707 B2  10/2011  Ueda
8,084,352 B2  12/2011  Harada et al.
(Continued)

FOREIGN PATENT DOCUMENTS

KR  10-2008-0030292  4/2008

*Primary Examiner* — Richard Booth
(74) *Attorney, Agent, or Firm* — Muir Patent Law, PLLC

(57) ABSTRACT

A method of manufacturing a semiconductor device includes forming grooves in a first dielectric layer on a substrate, the first dielectric layer including a first part between the grooves, forming a first barrier layer and an interconnect layer in each groove, recessing the interconnect layer and the first barrier layer, forming a capping pattern on the recessed interconnect layer, etching at least a portion of the first part by a first etching process, sequentially etching the capping pattern and the at least a portion of the IMD part by a second etching process to form a trench, conformally forming a second barrier layer in the trench and on the recessed interconnection layer, and forming a second dielectric layer on the second barrier layer not to fill the trench such that an air gap is formed in the trench.

20 Claims, 22 Drawing Sheets

(51) Int. Cl.
   *H01L 21/311* (2006.01)
   *H01L 21/3205* (2006.01)
   *H01L 23/528* (2006.01)

(52) U.S. Cl.
   CPC .. *H01L 21/31144* (2013.01); *H01L 21/32053* (2013.01); *H01L 21/7685* (2013.01); *H01L 23/528* (2013.01); *H01L 21/76843* (2013.01)

(56) References Cited

U.S. PATENT DOCUMENTS

| | | |
|---|---|---|
| 8,659,115 B2 | 2/2014 | Lin |
| 9,099,465 B2 | 8/2015 | Zhang |
| 9,123,727 B2 | 9/2015 | Fischer et al. |
| 9,812,353 B2 * | 11/2017 | Ahn .................... H01L 21/7682 |
| 2007/0035816 A1 | 2/2007 | Daamen et al. |
| 2009/0093100 A1 | 4/2009 | Xia et al. |
| 2015/0091175 A1 | 4/2015 | Chandhok et al. |

\* cited by examiner

1200

1300

1400

SEMICONDUCTOR DEVICE AND METHOD OF MANUFACTURING THE SAME

CROSS-REFERENCE TO RELATED APPLICATIONS

This application is a continuation application of U.S. patent application Ser. No. 15/353,984, filed Nov. 17, 2016, which claims priority under 35 U.S.C. §119 to Korean Patent Application No. 10-2015-0171797 filed on Dec. 3, 2015 and Korean Patent Application No. 10-2016-0015165 filed on Feb. 5, 2016 in the Korean Intellectual Property Office, the disclosures of all of which are hereby incorporated by reference in their entirety.

BACKGROUND

1. Technical Field

Example embodiments of the present disclosure relate to a semiconductor device and a method of manufacturing the same.

2. Description of the Related Art

A semiconductor device may include a plurality of electrical elements connected by metal interconnect layers. The metal interconnect layers may be formed through a back end-of-line (BEOL) process. The metal interconnect layers may be formed of copper and may be disposed in a dielectric layer. An air gap structure may be used to isolate the copper interconnect layers from each other. The air gap structure may prevent copper of the copper interconnect layer from diffusing into the dielectric layer.

SUMMARY

According to example embodiments of the inventive concept, a method of manufacturing a semiconductor device may comprise forming grooves in a first dielectric layer on a substrate, the first dielectric layer including a first part between the grooves, forming a first barrier layer in each groove, forming an interconnect layer on the first barrier layer to fill each groove, recessing the interconnect layer and the first barrier layer, forming a capping pattern on the recessed interconnect layer, the capping pattern being not formed on the first part, etching at least a portion of the first part by a first etching process, etching the at least a portion of the first part etched by the first etching process and the capping pattern, by a second etching process to form a trench, conformally forming a second barrier layer on a sidewall and a bottom surface of the trench and on a top surface of the recessed interconnection layer, and forming a second dielectric layer on the second barrier layer not to fill the trench such that an air gap is formed in the first part between the grooves.

According to example embodiments of the inventive concept, a method of manufacturing a semiconductor device may comprise forming grooves in a first dielectric layer on a substrate, the first dielectric layer including an first part between the grooves, forming a first barrier layer in each groove, forming an interconnect layer on the first barrier layer to fill each groove, recessing the interconnect layer and the first barrier layer, forming a first capping pattern and a second capping pattern on the recessed interconnect layer, the first and second capping patterns being not formed on the first part, etching at least a portion of the first part by a first etching process, etching the at least a portion of the first part etched by the first etching process and the second capping pattern, by a second etching process to form a trench, conformally forming a second barrier layer on a sidewall and a bottom surface of the trench and on the first capping pattern, and forming a second dielectric layer on the second barrier layer not to fill the trench such that an air gap is formed in the first part between the grooves.

According to example embodiments of the inventive concept, a method of manufacturing a semiconductor device may comprise forming grooves in a first dielectric layer on a substrate, the first dielectric layer including an first part between the grooves, forming a first barrier layer in each groove, forming an interconnect layer on the first barrier layer to fill each groove, recessing the interconnect layer and the first barrier layer, forming a first capping pattern, a second capping pattern, and a third capping pattern which are sequentially stacked, on at least the recessed interconnect layer, the first through third capping patterns being not formed on the first part, etching the at least a portion of the first part by a first etching process, etching the at least a portion of the first part etched by the first etching process and the second and third capping patterns, by a second etching process to form a trench, conformally forming a second barrier layer on a sidewall and a bottom surface of the trench and on the first capping pattern, and forming a second dielectric layer on the second barrier layer not to fill the second trench such that an air gap is formed in the first part between the grooves.

According to example embodiments of the inventive concept, a method of manufacturing a semiconductor device may comprise forming grooves in a first dielectric layer on a substrate, the first dielectric layer including a first part between the grooves; forming a first barrier layer in each groove; forming an interconnect layer on the first barrier layer to fill each groove; recessing the interconnect layer and the first barrier layer; forming a capping pattern on the recessed interconnect layer, the capping pattern being not formed on the first part; etching at least a portion of the first part by a first etching process; etching the at least a portion of the first part etched by the first etching process and the capping pattern, by a second etching process to form a trench; conformally forming a second barrier layer on a sidewall and a bottom surface of the trench and on a top surface of the recessed interconnection layer; and forming a second dielectric layer on the second barrier layer not to fill the trench such that an air gap is formed in the first part between the grooves, wherein forming of the air gap comprises forming the second dielectric layer on the second barrier layer not to fill the trench in a manner such that a bottom surface of the air gap is higher than a bottom surface of each groove.

BRIEF DESCRIPTION OF THE DRAWINGS

The aspects and features of the present disclosure will become more apparent by describing in detail example embodiments thereof with reference to the attached drawings, in which:

FIGS. 27 through 29 illustrate example electronic devices to which one or more semiconductor devices according to some embodiments of the inventive concept can be employed.

DETAILED DESCRIPTION OF THE EMBODIMENTS

In various embodiments of the inventive concept, an interconnect layer may be used to connect elements constituting an integrated circuit of a semiconductor chip. The elements may include, for example, a transistor, a diode, a power supply, a resistor, a capacitor, an inductor, a transmitter, a receiver, or antenna. The integrated circuit may be a digital circuit and/or an analog circuit, and may be a microprocessor, memory, an optical device, a logic device, and/or an audio amplifier.

FIGS. 1 through 11 are cross-sectional views illustrating a method of manufacturing a semiconductor device according to an example embodiment of the inventive concept.

Figure 1:
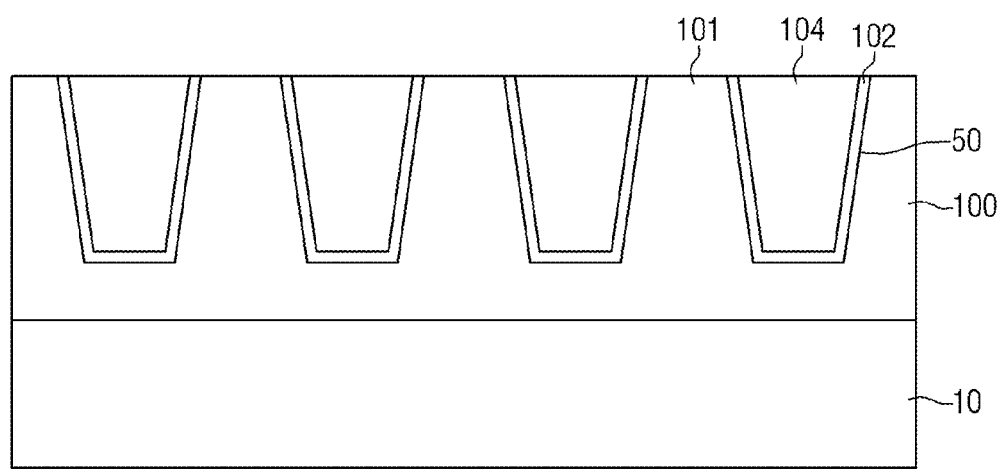
FIGS. 1 through 11 are cross-sectional views illustrating a method of manufacturing a semiconductor device according to an example embodiment of the inventive concept.

Referring to FIG. 1, a first dielectric layer 100 having grooves 50 formed therein may be formed on a substrate 10. The first dielectric layer 100 may include a low-k dielectric material. The first dielectric layer 100 may include, e.g., a low-k dielectric material having a dielectric constant (k) of less than 9, such as silicon oxide of which k is about 4, or silicon oxynitride of which k is about 4 to 8 according to an oxygen content and a nitrogen content.

In some embodiments, the formation of the grooves 50 in the first dielectric layer 100 may include forming a photoresist layer on the first dielectric layer 100 and patterning the photoresist layer to form a photoresist pattern for forming the grooves 50 using a photolithography process. The photoresist layer may be a positive photoresist layer or a negative photoresist layer. The photoresist layer may be formed by a spin coating process. After forming the photoresist pattern, the first dielectric layer 100 may be etched to a prescribed depth to form the grooves 50, and then the photoresist pattern on the dielectric layer 100 may be selectively removed by an ashing process.

The first dielectric layer 100 may be an interlayer dielectric (ILD) layer. The first dielectric layer 100 may comprise a single homogenous ILD layer or may be formed of a plurality of dielectric layers that form an ILD layer.

A first barrier layer 102 may be conformally formed to extend along a sidewall and a bottom surface of each of the grooves 50. An interconnect layer 104 may be formed on the first barrier layer 102 to fill each groove 50. In some embodiments, each of the sidewalls of the barrier layer 102 may diagonally extend upward from the bottom surface of the grooves 50 in a manner such that the width of an uppermost surface of the interconnect layer 104 in a first direction (e.g., left to right in FIG. 1) may be larger than the width of a lowermost surface of the interconnect layer 104 in the first direction, but the disclosure is not limited thereto. In some embodiments, each of the sidewalls of the barrier layer 102 may vertically extend upward from the bottom surface of the grooves 50 in a manner such that a width of an uppermost surface of the interconnect layer 104 in the first direction may be equal to a width of a lowermost surface of the interconnect layer 104 in the first direction. The sidewalls of groove 50 may have a similar diagonal extending form. It should be appreciated that the length of the interconnect layer 104 extending in and/or out of FIG. 1 corresponds to the longest dimension of the interconnect layer 104, but such length may not have a linear path (e.g., interconnect layer 104 may have bends as viewed from a top down perspective) so that the interconnect layer 104 may connect the various elements of the semiconductor device according to its design). The first barrier layer 102 may function as a protection layer to prevent a direct contact between the interconnect layer 104 and the first dielectric layer 100. The first barrier layer 102 may include a refractory metal, e.g., Ta, Ti, W, or an alloy thereof, and/or a refractory metal nitride, e.g., TaN, TiN, or WN, but the first barrier layer 102 are not limited thereto. In some embodiments, the first barrier layer 102 may be formed by, e.g., a physical vapor deposition (PVD) process, a chemical vapor deposition (CVD) process, or an electro-chemical plating (ECP) process.

The interconnect layer 104 may connect a plurality of elements of the integrated circuit. The interconnect layer 104 may be formed of copper (Cu). In some embodiments, the interconnect layer 104 may be formed of, e.g., Al, W, or Ag. The interconnect layer 104 may be formed by, e.g., a physical vapor deposition (PVD) process, a chemical vapor deposition (CVD) process, or an electro-chemical plating (ECP) process. An upper portion of the first dielectric layer 100 which is positioned between the grooves 50 may be defined as an intermetal dielectric (IMD) part 101. For example, the IMD part 101 may be a portion of the first dielectric layer 100 which is positioned between the interconnect layers 104. The IMD part 101 may act to electrically isolate the interconnect layers 104 so that each interconnect layer 104 may form a separate electrical node.

The IMD part 101 may protrude from a lower portion of the first dielectric layer 100 under the grooves 50 or the interconnect layer 104 in a manner such that a width of an uppermost surface of the IMD part 101 in a first direction (left to right in FIG. 1) may be smaller than a width of a lowermost surface of the IMD part 101 in the first direction, but the disclosure is not limited thereto. In some embodiments, the IMD part 101 may vertically protrude from a lower portion of the first dielectric layer 100 under the grooves 50 or the interconnect layer 104 in a manner such that a width of the uppermost surface of the IMD part 101 in the first direction may be equal to a width of the lowermost surface of the IMD part 101 in the first direction.

Figure 2:
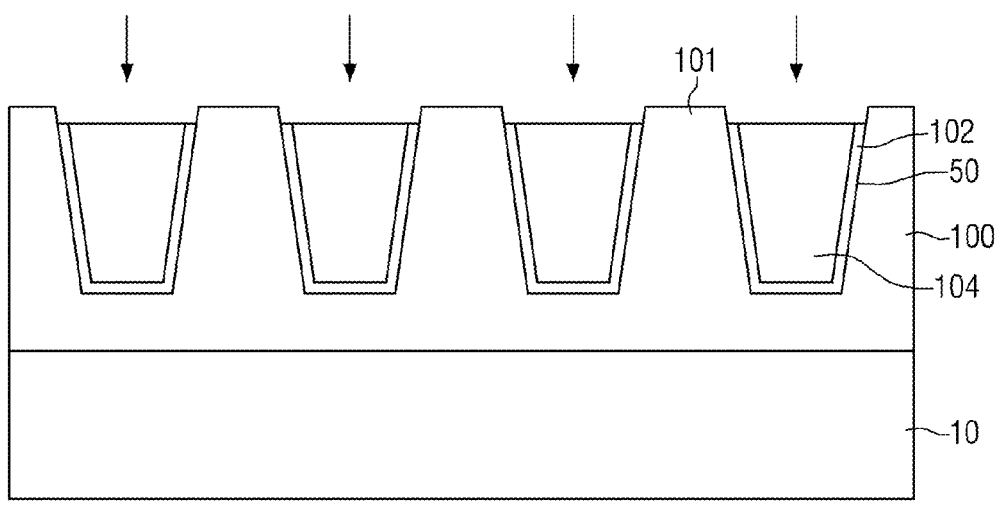

Referring to FIG. 2, in some embodiments, the interconnect layer 104 may be recessed in each groove 50. The interconnect layer 104 may be recessed by a strip process using diluted hydro fluoric acid (DHF). For example, to recess the interconnect layer 104, the DHF strip process may be repeated several times, e.g., twice or three times. DHF may include, e.g., a 200:1 HF solution. A recessed depth of the interconnect layer 104 may be less than 5 nm, but the depth is not limited thereto. In some embodiments, the recessed depth of the interconnect layer 104 may be 4 nm or 3 nm. When the interconnected layer 104 is recessed, the first barrier layer 102 may also be recessed.

Accordingly, upper portions of the grooves 50 may be exposed, and a portion of a sidewall of the IMD part 101 may be exposed.

Figure 3:
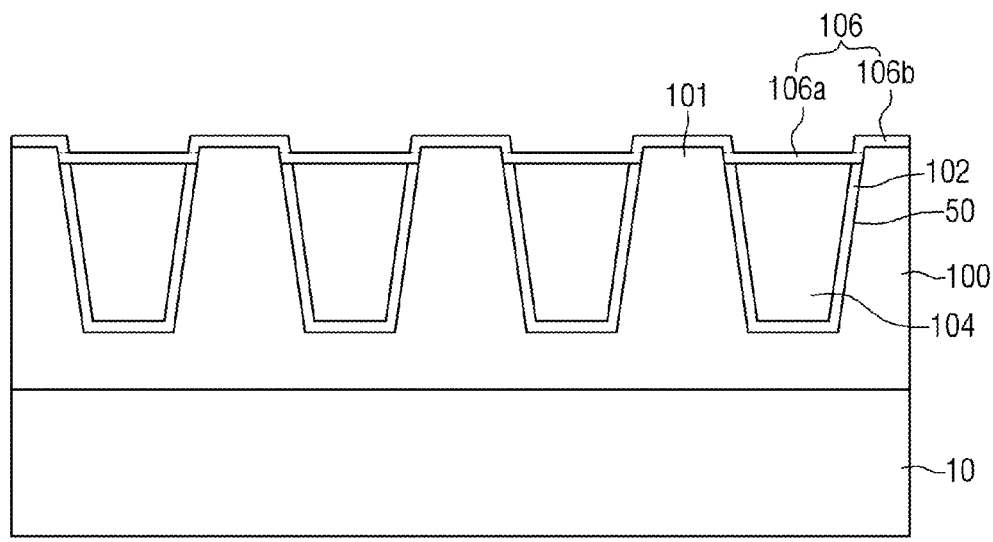
Figure 4:
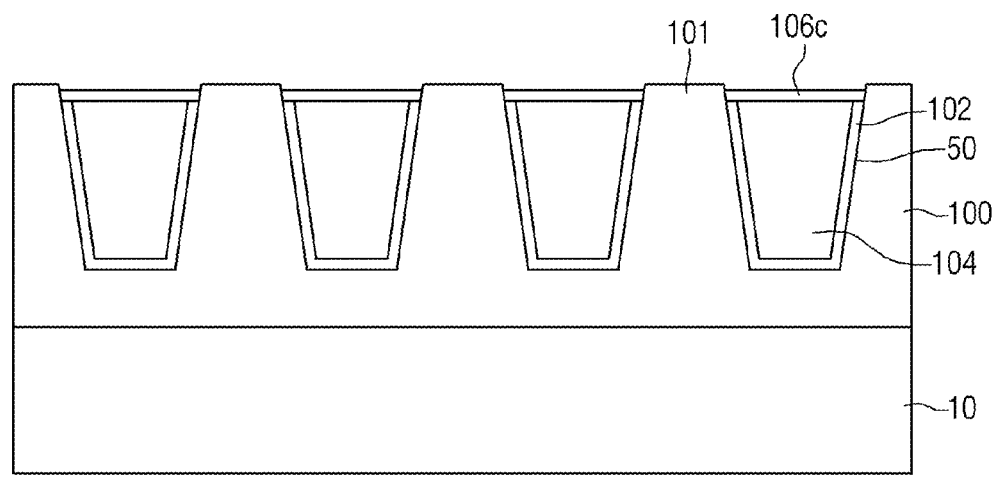

Referring to FIGS. 3 and 4, in some embodiments, a capping pattern 106c may be formed only on the recessed interconnect layer 104 and the recessed first barrier layer 102.

Referring to FIG. 3, a capping layer 106 may be formed on the recessed interconnect layer 104, the recessed first barrier layer 102 and the first dielectric layer 100. The capping layer 106 may be formed of or include AlN. For example, AlN may be deposited on a top surface of the recessed interconnect layer 104 and on the exposed sidewall and the top surface of the IMD part 101 by a PVD process, a CVD process, a ECP process or an atomic layer deposition (ALD) process. In this case, the capping layer 106 may include a first portion 106a that is on the recessed interconnect layer 104 and the recessed first barrier layer 102 and a second portion 106b that is on the IMD part 101. The first portion 106a of the capping layer 160 may include AlN and the second portion 106b of the capping layer 160 may include AlON. AlON may be easily removed by HF compared to AlN.

Referring to FIG. 4, the second portion 106b of the capping layer 160 may be selectively removed using a DHF strip process.

Thus, the capping pattern 106c (e.g., an AlN capping pattern) may be formed only on the recessed interconnect layer 104 and the recessed first barrier layer 102. The capping pattern 106c may not be formed on the IMD part 101. The capping pattern 106c may function as a protection layer to protect the interconnect layer 104 during an etching process which will be described in connection with FIG. 7

Figure 5:
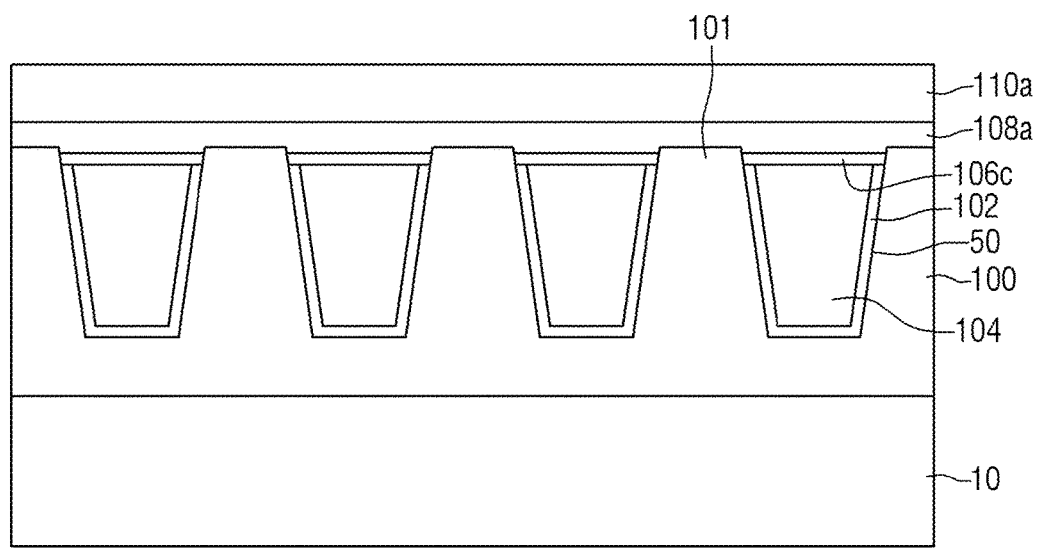
Figure 6:
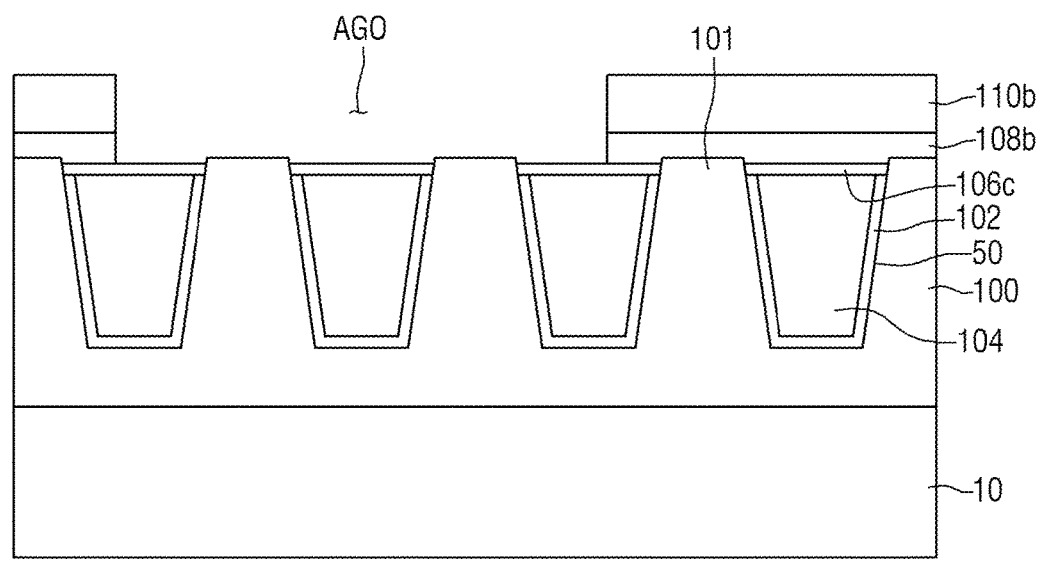

Referring to FIGS. 5 and 6, in some embodiments, a sacrificial mask pattern 108b and a hard mask pattern 110b which have an air gap region opening AGO may be formed on the first dielectric layer 100 having the interconnect layer 104. The air gap region opening AGO may expose at least a portion of the IMD part 101 to be removed so as to form an air gap. For example, the at least a portion of the IMD part 101 exposed by the air gap region opening AGO may be removed by an etching process which will be described in connection with FIGS. 7 through 9 such that the air gap 118 which will be described in connection with FIG. 11 may be formed. At least a portion of the capping patterns 106c may be exposed by the air gap region opening AGO.

More specifically, referring to FIG. 5, the sacrificial mask layer 108a and the hard mask layer 110a may be sequentially formed on the first dielectric layer 100 having the interconnect layer 104. The sacrificial mask layer 108a may be formed of, e.g., silicon nitride (SiN), but not limited thereto. The hard mask layer 110a may be formed of, e.g., silicon oxynitride (SiON), but not limited thereto.

Referring to FIG. 6, the sacrificial mask layer 108a and the hard mask layer 110a may be partially removed using a photolithography process to define the air gap region opening AGO. For example, the sacrificial mask pattern 108b and the hard mask pattern 110b may be formed to expose the portion of the IMD part 101 and the portion of the capping patterns 106c.

Figure 7:
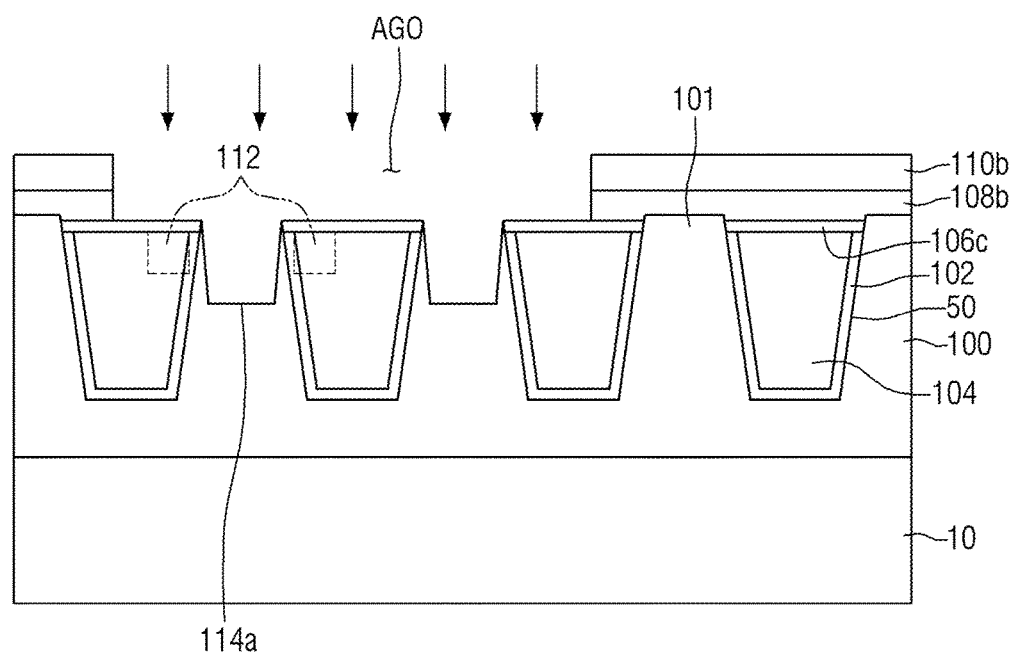

Referring to FIG. 7, the IMD part 101 exposed by the air gap region opening AGO may be etched by a first etching process using the hard mask pattern 110b and the sacrificial mask pattern 108b as an etch mask. The first etching process may include a dry etching, e.g., an anisotropic dry etching process. During the first etching process, due to a high etch selectivity between the capping pattern 106c and the IMD part 101, the capping pattern 106c may not be removed by the first etching process. During the first etching process, a portion of the hard mask pattern 110b may be etched. In some embodiments, the hard mask pattern 110b may not be removed by the first etching process.

After the first etching process, the top surfaces of the interconnect layer 104 and the first barrier layer 102 may still be covered with the capping pattern 106c and may not be exposed. For example, the interconnect layer 104 and the first barrier layer 102 which are protected by the capping pattern 106c may not contact the etchant of the first etching process and not be etched by the first etching process.

When the first etching process is performed, an edge portion 112 of the interconnect layer 104 may be protected from an etching damage by the capping pattern 106c, thus a loss of the interconnect layer (e.g., copper loss) may be prevented or reduced. Herein, the edge portion 112 may include a region in which an upper portion of the interconnect layer 104 and an upper portion of the first barrier layer 102 is in contact with each other. For example, edge portion 112 may comprise an uppermost portion of the edge portion 112 directly contacting the capping pattern 106c.

After the portion of the IMD part 101 is removed, a first air gap trench 114a may be formed between the interconnect layers 104. In some embodiments, a depth of the first air gap trench 114a may be smaller or greater than the recessed depth of the interconnect layer 104.

Figure 8:
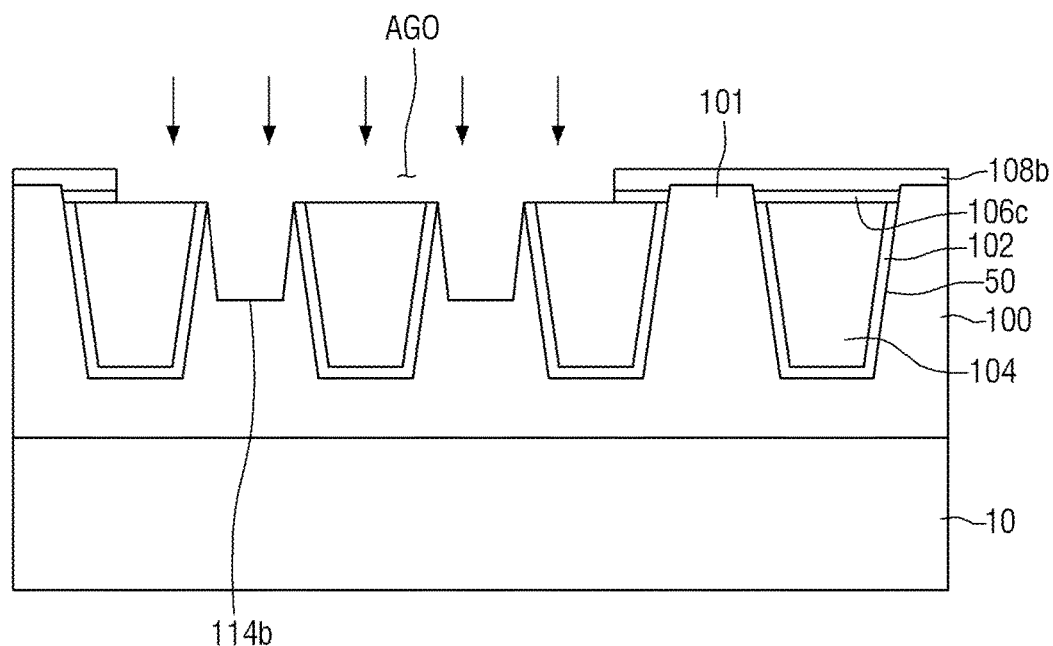
Figure 9:
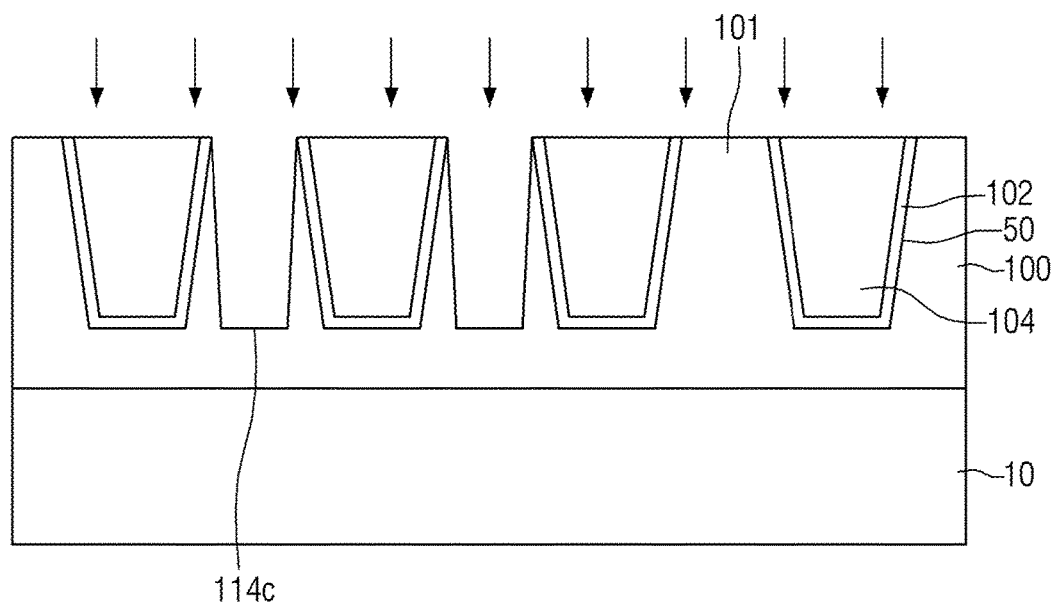

Referring to FIGS. 8 and 9, a third air gap trench 114c may be formed between the interconnect layers 104 by sequentially etching the IMD part 101 in which the first air gap trench 114a is formed and which exposed by the air gap region opening AGO, using a second etching process. The second etching process may include at least one of an EKC strip process, an NH₃ RF plasma process, and a hydro fluoric acid strip process, but the second etching process is not limited thereto. The second etching process may also include a first sub etching process and a second sub etching process.

For example, a wet etching process such as the EKC strip process may be performed as the first sub etching process of the second etching process to etch deeply the IMD part 101 having the first air gap trench 114a such that a depth of the second air gap trench 114b is greater than that of the first air gap trench 114a. By the wet etching process, a portion of the capping patterns 106c may be removed. Furthermore, the hard mask pattern 110b may be entirely removed and the sacrificial mask pattern 108b may be partially removed during the wet etching process. In some embodiments, the first sub etching process using the NH₃ RF plasma process and the hydro fluoric acid strip process may be performed.

Referring to FIG. 9, a second sub etching process of the second etching process may be immediately performed after the first sub etching process to form a third air gap trench 114c.

For example, the second sub etching process using the NH₃ RF plasma process and the hydro fluoric acid strip process may be performed on the IMD part 101 having the second air gap trench 114b to form the third air gap trench 114c of which a depth is greater than that of the second air gap trench 114b. In some embodiments, after the second sub etching process, a depth of the third air gap trench 114c may be greater than the recessed depth of the interconnect layer 104. In some embodiments, after the second etching process, a bottom surface of the third air trench 114c may be higher or lower than a bottom surface of each groove 50. In some embodiments, an upper portion of the third air gap trench 114c may be wider than a lower portion of the third air gap trench 114c. For example, a width of the upper portion of the third air gap trench 114c near the capping patterns 106c may be greater than a width of the lower portion of the third trench 114c near the bottom surface of the interconnect layer 104, but the disclosure is not limited thereto. In some embodiments, a width of the upper portion of the third air gap trench 114c near the capping patterns 106c may be the same as a width of the lower portion of the third trench 114c near the bottom surface of the interconnect layer 104.

In some embodiments, when the second sub etching process is performed, the capping patterns 106c and the sacrificial mask pattern 108b may be entirely removed. Thus, a portion of the IMD part 104 covered by the sacrificial mask pattern 108b may also be partially etched while forming the third gap air trench 114c. In some embodiments, the second sub etching process may be performed using the EKC strip process. In some embodiments, any one of the first sub etching process and the second sub etching process may be omitted.

According to example embodiments, since the capping pattern 106c, the sacrificial pattern 108b, and the hard mask pattern 110b are removed by the etching processes as described above, an additional planarization process on the interconnect layer 104 and the IMD part 101 may not be performed. By the above etching processes, the planarization process may be performed. As a result, after the second etching process, a top surface of the IMD part 101 and a top surface of the interconnect layer 104 may be substantially coplanar.

Figure 10:
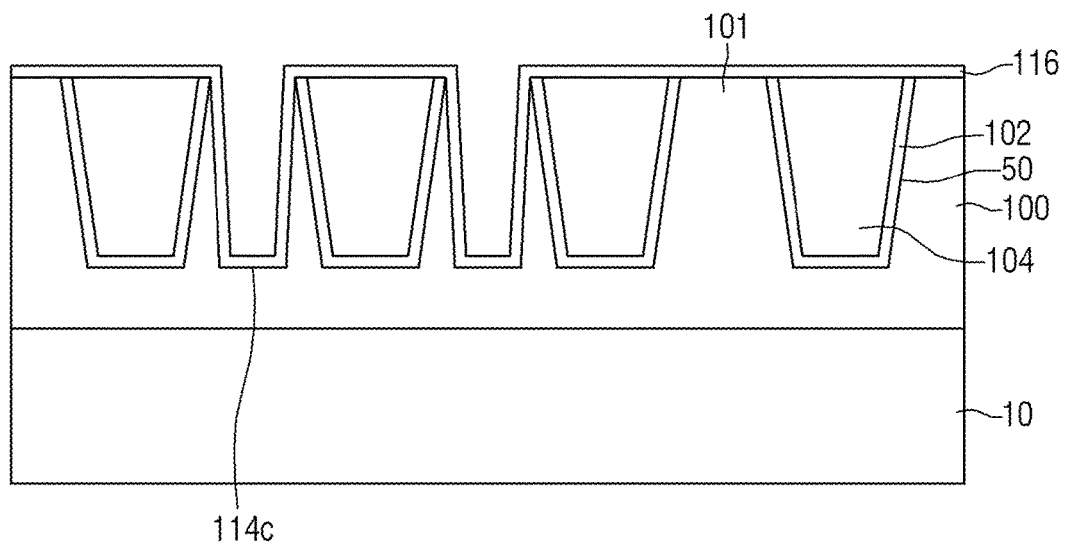

Referring to FIG. 10, a second barrier layer 116 may be conformally formed on a sidewall and a bottom surface of the third air gap trench 114c.

Figure 11:
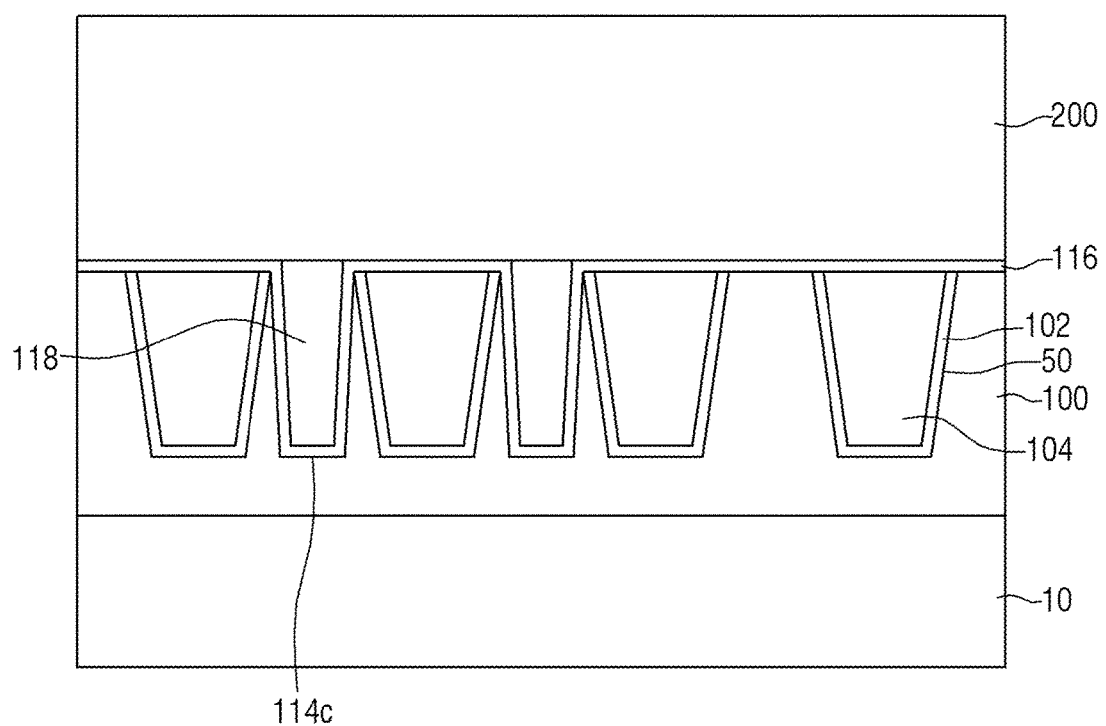

The second barrier layer 116 may function as a protection layer to prevent a direct contact between the interconnect layer 104 and another layer including a second dielectric layer 200 of FIG. 11. The second barrier layer 116 may further be conformally formed on the top surface of the interconnect layer 104 and the top surface of the IMD part 101.

The second barrier layer 116 may be formed or include, e.g., SiCN, but not limited thereto. The second barrier layer 116 may be formed on the IMD part 101 and the interconnect layer 104 by a physical vapor process, a chemical vapor deposition process, or atomic layer deposition process.

Referring to FIG. 11, the second dielectric layer 200 may be formed on the second barrier layer 116. By forming the second dielectric layer 200 on the second barrier layer 116 not to fill the third air gap trench 114c, the air gap 118 may be formed in the IMD part 101 (or the third air gap trench 114c), and further an interconnection structure or an integrated circuit which has a stacked structure may be formed. In some embodiments, a bottom surface of the air gap 118 may be higher than a bottom surface of each groove 50. The second dielectric layer 200 may include a low-k dielectric material. In some embodiments, the second dielectric layer 200 may be substituted with another arbitrary material used in a semiconductor manufacturing process.

In the method of manufacturing the semiconductor device according to the example embodiment as described above, by recessing the interconnect layer 104 (e.g., copper interconnect layer) and forming the capping pattern 106c (e.g., the AlN capping pattern) on the recessed interconnect layer 104, the interconnect layer 104 (e.g., the edge portion 112) may be protected from the etching damage by the capping pattern 106c while performing the etching processes on the IMD part 101. Therefore, the loss of the interconnect layer (e.g., copper loss) may be prevented or reduced.

FIGS. 12 through 20 are cross-sectional views illustrating a method of manufacturing a semiconductor device according to an example embodiment.

Figure 12:
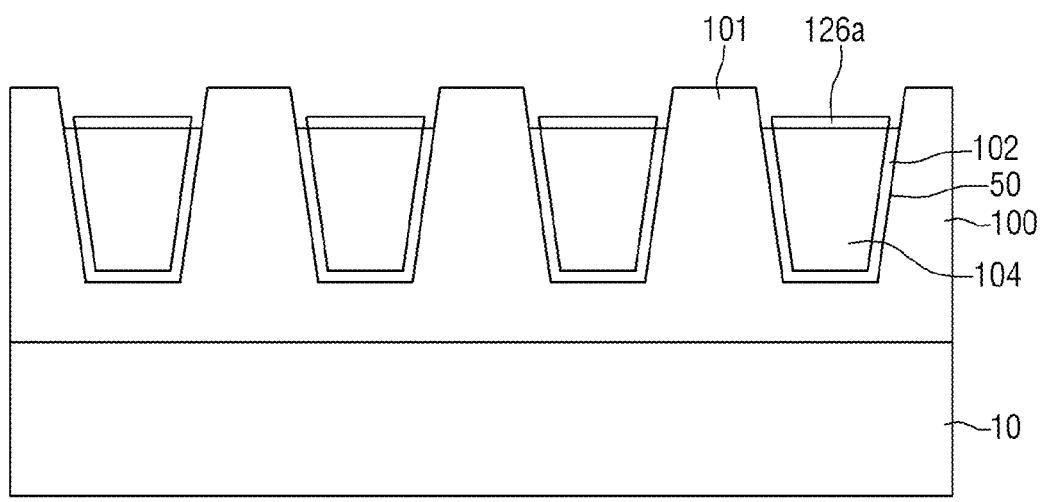
FIGS. 12 through 20 are cross-sectional views illustrating a method of manufacturing a semiconductor device according to an example embodiment of the inventive concept.

Referring to FIG. 12, as described in connection with FIGS. 1 and 2, the grooves 50 in the first dielectric layer 100 on the substrate 10 may be formed, the first barrier layer 102 may be conformally formed on the sidewall and the bottom surface of each of the grooves 50, the interconnect layer 104 may be formed on the first barrier layer 102 to fill each of the grooves 50, and then the interconnect layer 104 and the first barrier layer 102 may be recessed. The upper portion of the first dielectric layer 100 which are positioned between the grooves 50 may be defined as the IMD part 101.

In some embodiments, a first capping pattern 126a may be formed only on the recessed interconnect layer 104 (e.g., on the top surface of the recessed interconnect layer 104) and may not be formed on the top surface of the first barrier layer 102. Therefore, the top surface of the first barrier layer 102 may be exposed. The first capping pattern 126a may be formed of or include cobalt (Co). For example, when Co is deposited on the substrate 10 by a CVD process using cobalt precursor, Co may be selectively deposited only on the recessed interconnect layer 104 but may not be deposited on the IMD part 101 and the first barrier layer 102. Thus, the first capping pattern 126a (e.g., a Co capping pattern) may be formed only on the recessed interconnect layer 104. In some embodiments, the first capping pattern 126a may further be formed on the recessed first barrier layer 102.

Figure 13:
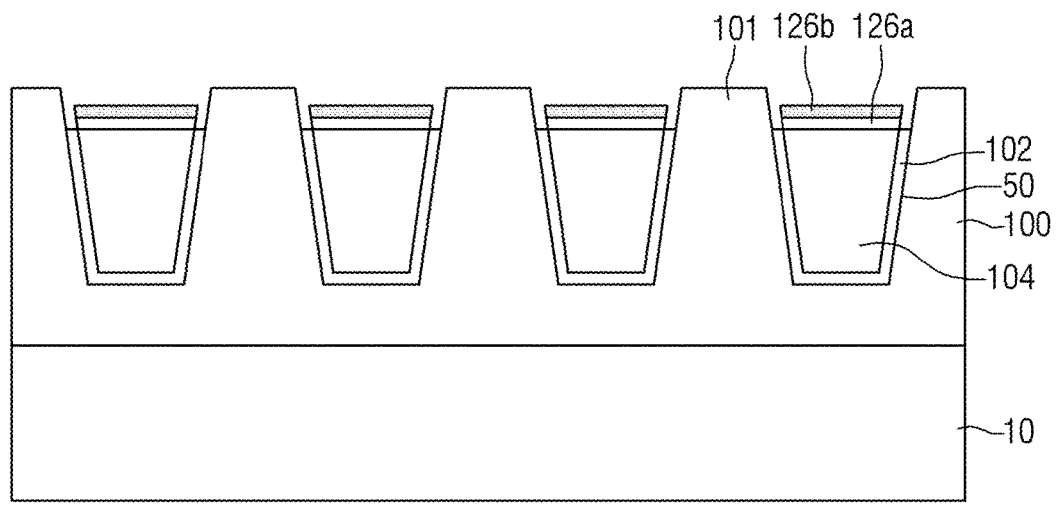

Referring to FIG. 13, a second capping pattern 126b may be formed on the first capping pattern 126a by performing a silicidation process and a nitrification process on the first capping pattern 126a. For example, by a reaction of Co of the first capping pattern 126a (i.e., the Co capping pattern), silane ($SiH_4$), and ammonia ($NH_3$), the second capping pattern 126b being formed of or including CoSiN (i.e., a CoSiN capping pattern) may be formed on the first capping pattern 126a. The second capping pattern 126b and the first capping pattern 126a may function as a protection layer to protect the interconnect layer 104 during an etching process which will be described in connection with FIG. 16. In some embodiments, the second capping layer 126b may include a CoSi capping pattern formed by a reaction of Co of the first capping pattern 126a and silane ($SiH_4$).

Figure 14:
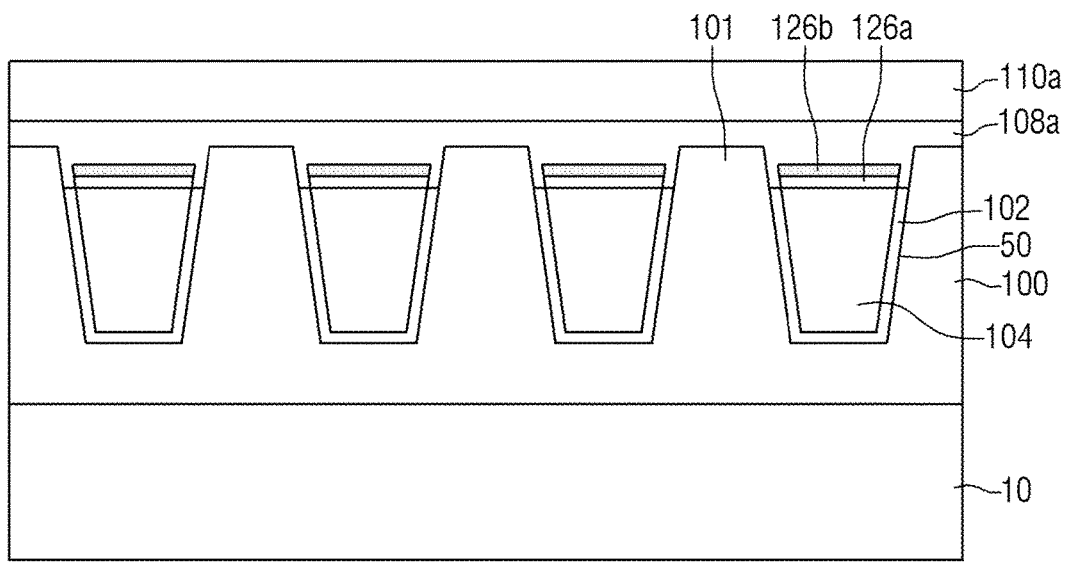
Figure 15:
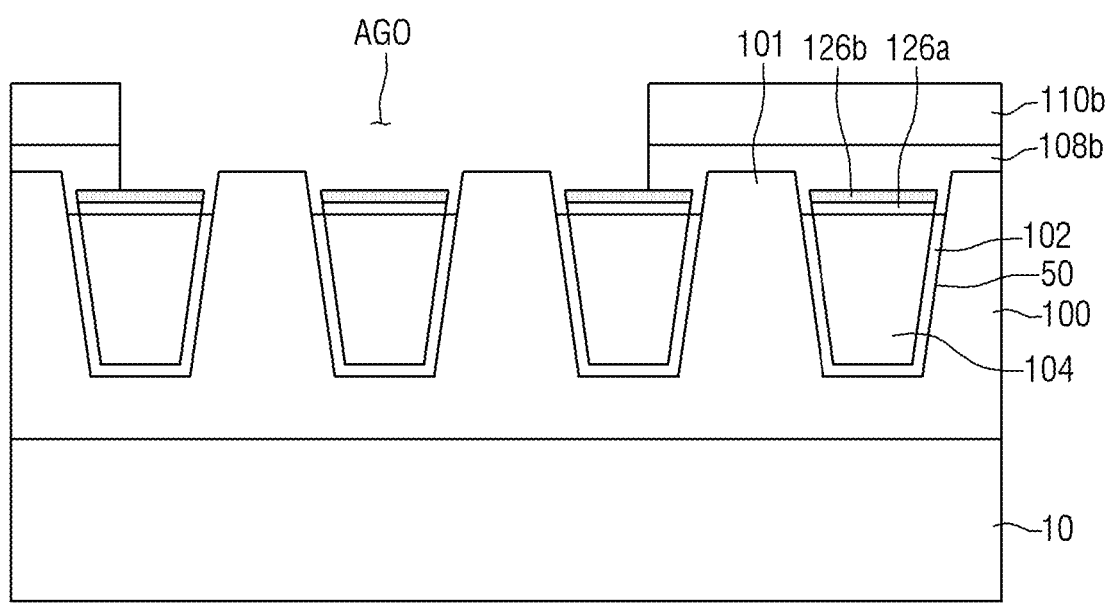

Referring to FIGS. 14 and 15, as described in connection with FIGS. 5 and 6, the sacrificial mask pattern 108b and the hard mask pattern 110b having the air gap region opening AGO may be formed. The air gap region opening AGO may expose a portion of the IMD part 101 and the second capping patterns 126b.

As illustrated in FIG. 14, the sacrificial mask layer 108a and the hard mask layer 110a may be formed on the substrate 10 and then sacrificial mask layer 108a and the hard mask layer 110a may be partially removed so as to define the air gap region opening AGO as illustrated in FIG. 15 such that the sacrificial mask pattern 108b and the hard mask pattern 110b having the air gap region opening AGO are formed.

The sacrificial mask layer 108a may be formed of silicon nitride (SiN), but not limited thereto. The hard mask layer 110a may be formed of silicon oxynitride (SiON), but not limited thereto.

Figure 16:
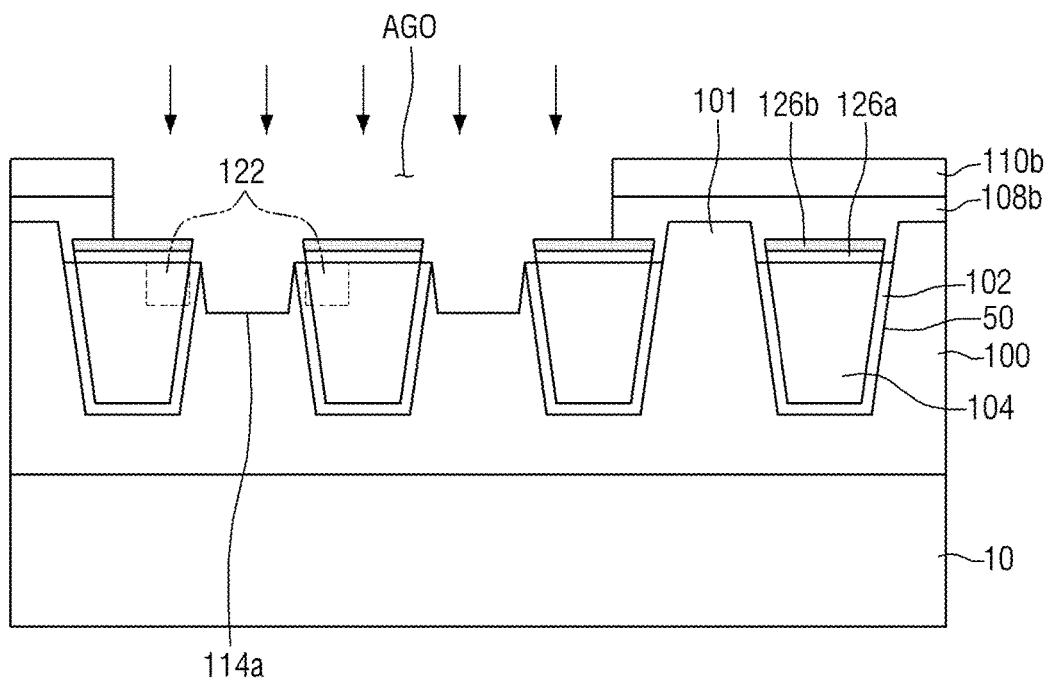

Referring to FIG. 16, at least a portion of the IMD part 101 exposed by the air gap region opening AGO may be etched by a first etching process.

The first etching process may include a dry etching process, e.g., an anisotropic dry etching process. While performing the first etching process, due to a high etch selectivity between the second capping pattern 126b and the IMD part 101, the second capping pattern 126b may not be etched and a portion of the IMD part may be etched. During the first etching process, a portion of the hard mask pattern 110b may be etched. In some embodiments, the hard mask pattern 110b may not be etched during the first etching process.

After the first etching process, the top surfaces of the interconnect layer 104 may still be covered with the first and second capping patterns 126a and 126b and may not be exposed. For example, the interconnect layer 104 which are protected by the first and second capping patterns 126a and 126b may not be etched by the first etching process.

When the first etching process is performed, an edge portion 122 of the interconnect layer 104 may be protected from an etching damage by the first and second capping patterns 126a and 126b, thus a loss of the interconnect layer (e.g., copper loss) may be prevented or reduced. Herein, the edge portion 122 may include a region in which an upper portion of the interconnect layer 104 and an upper portion of the first barrier layer 102 is in contact with each other. For example, the uppermost portion of the edge portion 122 may directly contact the first capping pattern 126a.

After the portion of the IMD part 101 is removed, the first air gap trench 114a may be formed.

Figure 17:
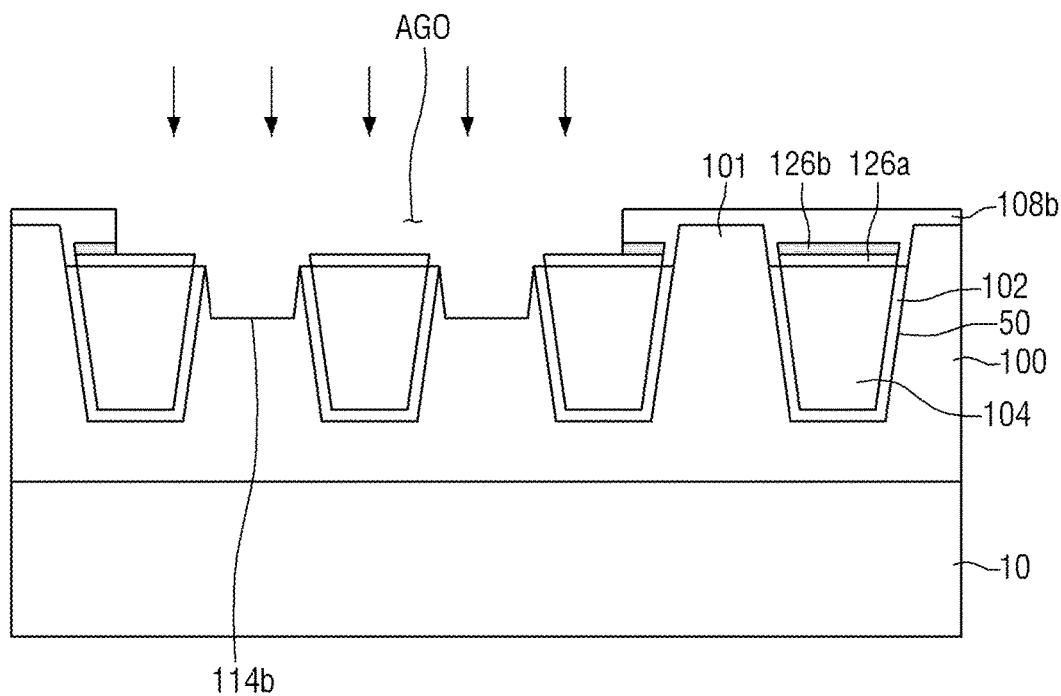
Figure 18:
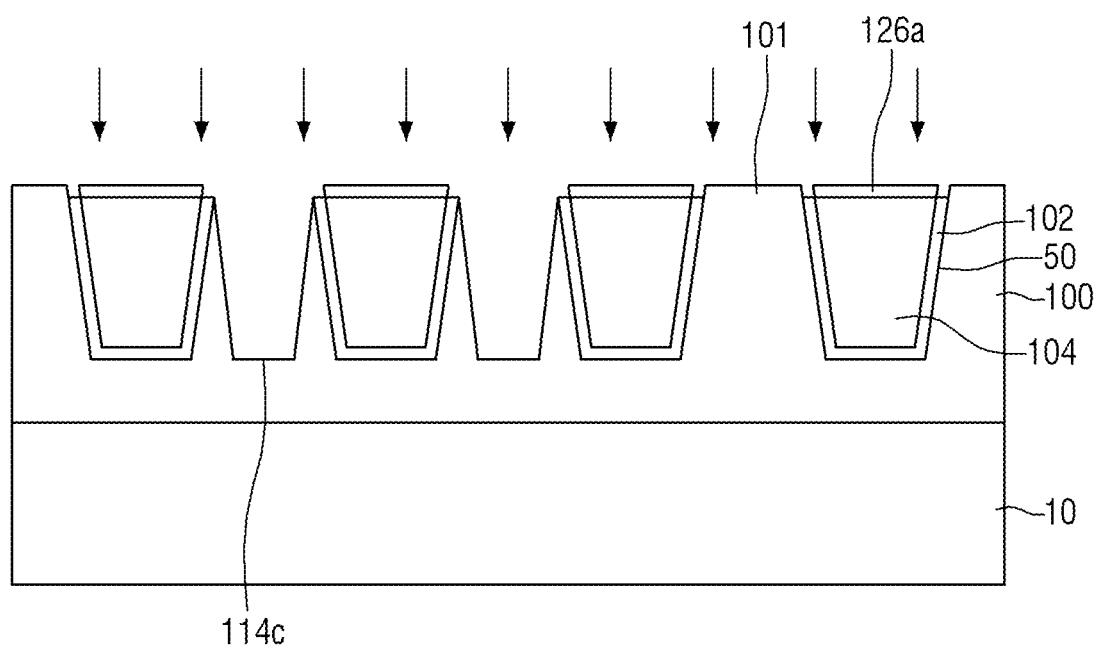

Referring to FIGS. 17 and 18, the IMD part 101 in which the first air gap trench 114a is formed and which is exposed by the air gap region opening AGO may be sequentially etched by a second etching process along with the second capping pattern 126b such that a third air gap trench 114c may be formed between the interconnect layers 104.

The second etching process may include at least one of an EKC strip process, $NH_3$ RF plasma process, and a hydro fluoric acid strip process. The second etching process may include a first sub etching process and a second etching process.

Referring to FIG. 17, a wet etching process such as the EKC strip process may be performed as the first sub etching process of the second etching process so as to deeply etch the IMD part having the first air gap trench 114a, thus the second air gap trench 114b of which a depth is greater than that of the first air gap trench 114a may be formed. By the wet etching process, a portion of the second capping patterns 126b may be removed. Further, the hard mask pattern 110b may be entirely removed and a portion of the sacrificial mask pattern 108b may be removed.

In this case, the first capping pattern 126a may not be removed by the first sub etching process. In some embodiments, the first sub etching process may be performed using the $NH_3$ RF plasma process and the hydro fluoric acid strip process.

Referring to FIG. 18, the second sub etching process of the second etching process may be sequentially performed to form a third gap trench 114c. For example, the second sub etching process using the $NH_3$ RF plasma process and the hydro fluoric acid strip process may be performed to deeply etch the IMD part 101 having the second air gap trench 114b, thus a third air gap trench 114c may be formed of which a depth is greater than that of the second air gap trench 114b. In some embodiments, after the second etching process, a bottom surface of the third air trench 114c may be higher or lower than a bottom surface of each groove 50. In some embodiments, an upper portion of the third air gap trench 114c may be wider than a lower portion of the third air gap trench 114c. For example, a width of the upper portion of the third air gap trench 114c near the first capping pattern 126a may be greater than a width of the lower portion of the third trench 114c near the bottom surface of the interconnect layer 104, but the disclosure is not limited thereto. In some embodiments, a width of the upper portion of the third air gap trench 114c near the first capping pattern 126a may be the same as a width of the lower portion of the third trench 114c near the bottom surface of the interconnect layer 104. By the $NH_3$ RF plasma process and the hydro fluoric acid strip process, the second capping pattern 126b and the sacrificial mask pattern 108b may be entirely removed. As a result, the first capping pattern 126a (e.g., Co capping pattern) may not be removed and remain on the interconnect layer 104. In some embodiments, the first capping pattern 126a may be removed by the second sub etching process to expose the top surface of the interconnect layer 104.

In some embodiments, the second sub etching process may be performed using the EKC strip process. In some embodiments, any one of the first sub etching process and the second sub etching process may be omitted.

According to example embodiments, since the second capping pattern 126b, the sacrificial pattern 108b, and the hard mask pattern 110b are removed by the etching processes as described above, an additional planarization process on the interconnect layer 104 and the IMD part 101 may not be performed. By the above etching processes as described in FIGS. 16 through 18, the planarization process may be performed. As a result, after the second etching process, a top surface of the IMD part 101 and a top surface of the interconnect layer 104 (or a top surface of the first capping pattern 126a) may be substantially coplanar.

Figure 19:
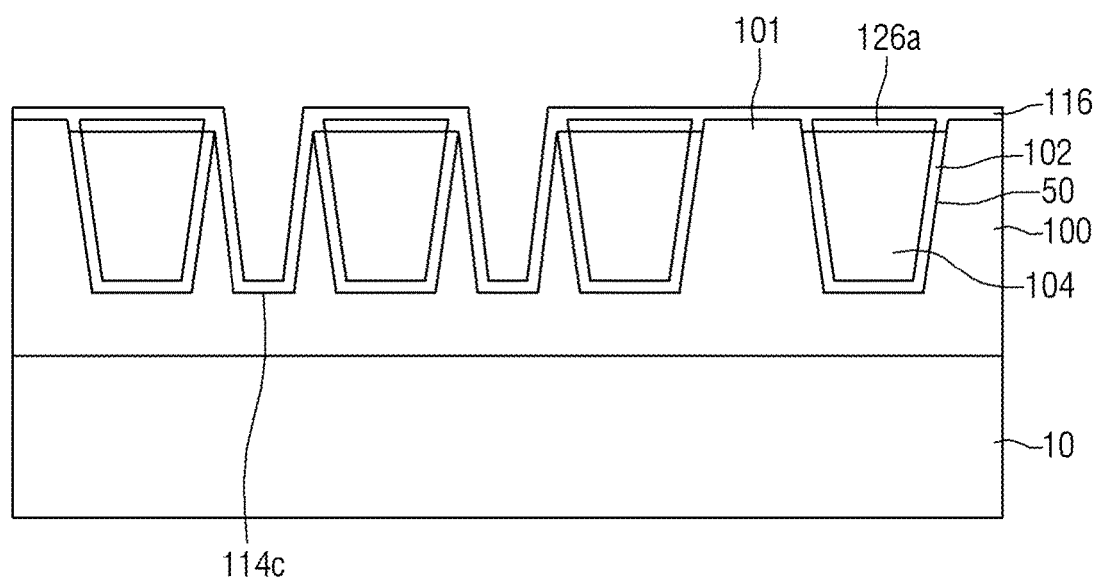
Figure 20:
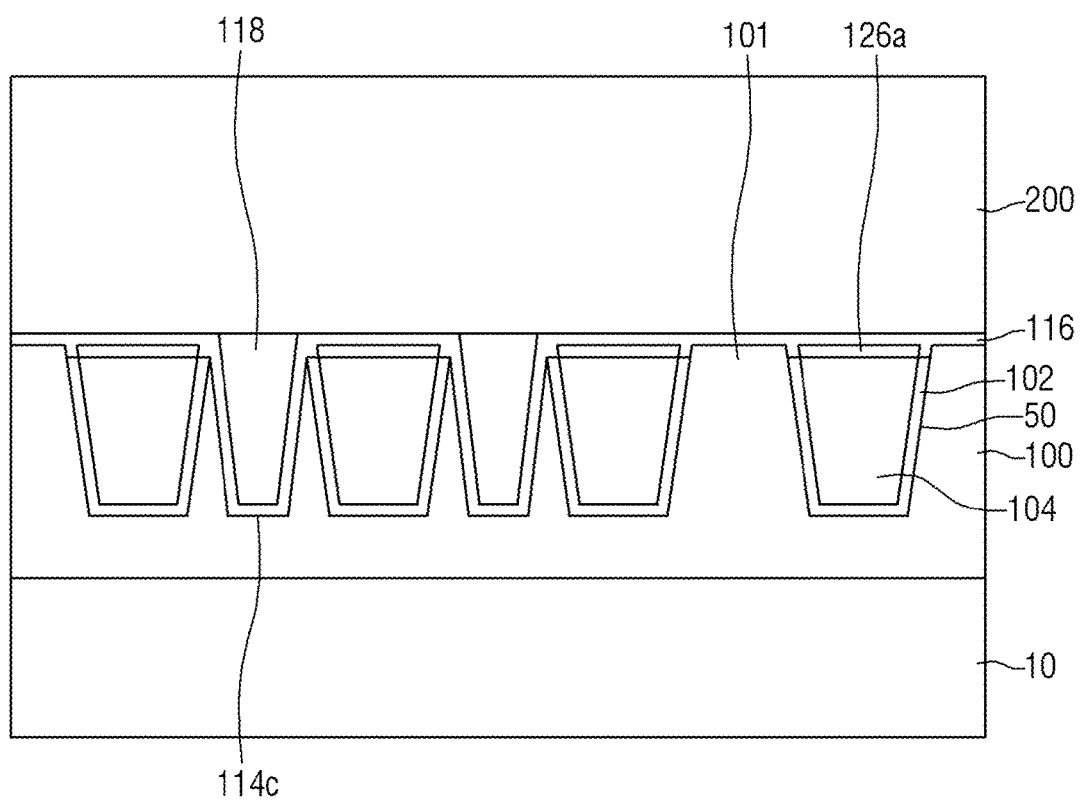

Referring to FIG. 19, a second barrier layer 116 may be conformally formed on a sidewall and a bottom surface of the third air gap trench 114c.

The second barrier layer 116 may further be conformally formed on the top surface of the first capping pattern 126a (e.g., the Co capping pattern) and the top surface of the IMD part 101.

In some embodiments, the second barrier layer 116 may be conformally formed on the sidewall and the bottom surface of the third air gap trench 114c, the top surface of the interconnect layer 104, and the top surface of the IMD part 101.

The second barrier layer 116 may be formed of or include, e.g., SiCN, but not limited thereto.

Referring back to FIG. 11, the second dielectric layer 200 may be formed on the second barrier layer 116. By forming the second dielectric layer 200 on the second barrier layer 116 not to fill the third air gap trench 114c, the air gap 118 may be formed in the IMD part 101 (or the third air gap trench 114c), and further an interconnection structure or an integrated circuit which has a stacked structure may be formed. In some embodiments, a bottom surface of the air gap 118 may be higher than a bottom surface of each groove 50. The second dielectric layer 200 may include a low-k dielectric material. In some embodiments, the second dielectric layer 200 may be substituted with another arbitrary material used in a semiconductor manufacturing process.

In the method of manufacturing the semiconductor device according to the example embodiment as described above, by recessing the interconnect layer 104 (e.g., copper interconnect layer) and forming the first capping pattern 126a (e.g., Co capping pattern) and the second capping pattern (e.g., CoSiN capping pattern) on the recessed interconnect layer 104, the interconnect layer 104 (e.g., the edge portion 122) may be protected from the etching damage by the first and second capping patterns 126a and 126b while performing the etching processes on the IMD part 101. Therefore, the loss of the interconnect layer (e.g., copper loss) may be prevented or reduced.

Referring to FIGS. 21 through 26 are cross-sectional views illustrating a method of a semiconductor device according to an example embodiment of the inventive concept.

Figure 21:
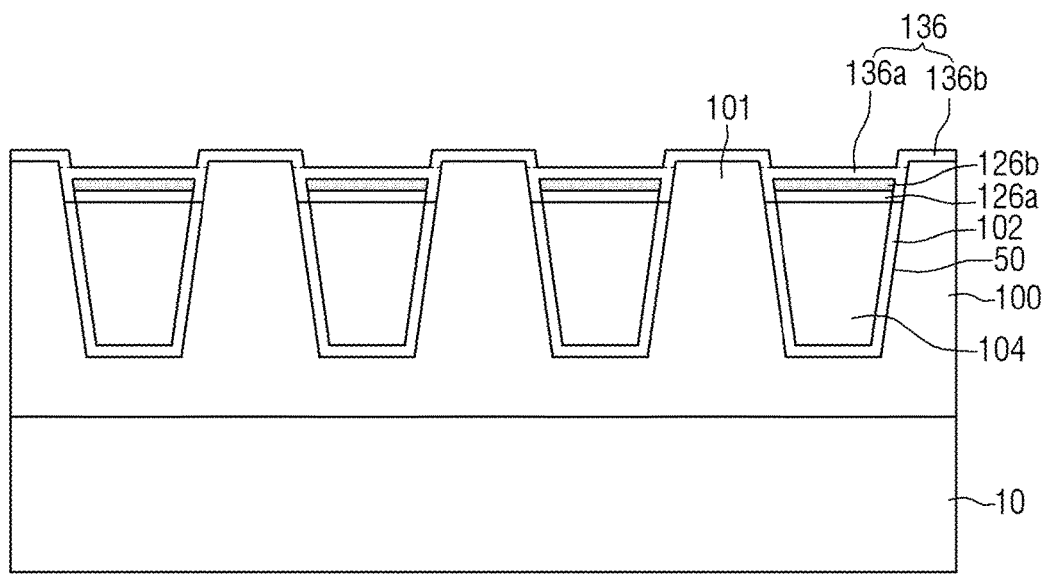
FIGS. 21 through 28 are cross-sectional views illustrating a method of manufacturing a semiconductor device according to an example embodiment of the inventive concept.

Referring to FIG. 21, as described in connection with FIGS. 1 and 2, the grooves 50 in the first dielectric layer 100 on the substrate 10 may be formed, the first barrier layer 102 may be formed on the sidewall and the bottom surface of each of the grooves 50, the interconnect layer 104 may be formed on the first barrier layer 102 to fill each of the grooves 50, and then the interconnect layer 104 and the first barrier layer 102 may be recessed. The upper portion of the first dielectric layer 100 which are positioned between the grooves 50 may be defined as the IMD part 101.

As described in connection with FIGS. 12 and 13, the first capping layer 126a may be formed on the recessed interconnect layer 104. The first capping layer 126a may be formed of or include Co (or the first capping layer 126a may be a Co capping pattern). The silicidation process and the nitrification process may be performed on the first capping pattern (e.g., the Co capping pattern) to form the second capping pattern 126b on the first capping pattern 126a. For example, the second capping pattern 126b may be formed by reaction with Co of the Co capping pattern, silane ($SiH_4$) and ammonia ($NH_3$). Thus, the second capping pattern 126b may be formed of or include SiCN (or the second capping pattern 126a may be a CoSiN capping pattern). In some embodiments, the second capping layer 126b may include a CoSi capping pattern formed by a reaction of Co of the first capping pattern 126a and silane ($SiH_4$).

A capping layer 136 may be formed on the second capping pattern 126b and the IMD part 101. The capping layer 136 may be formed on the first barrier layer 102.

The capping layer 136 may be formed of or include AlN. The capping layer 136 may be formed by depositing AlN on the substrate 10 using a CVD process, a PVD process, an ECP process, or an ALD process.

In this case, the capping layer 136 may include a first portion 136a that is on the second capping pattern 126b and the first barrier layer 102 and a second portion 136b that is on the IMD part 101. The first portion 136a of the capping layer 136 may be formed of AlN and the second portion 136b of the capping layer 136 may be formed of AlON. AlON may be easily removed by HF compared to AlN.

Figure 22:
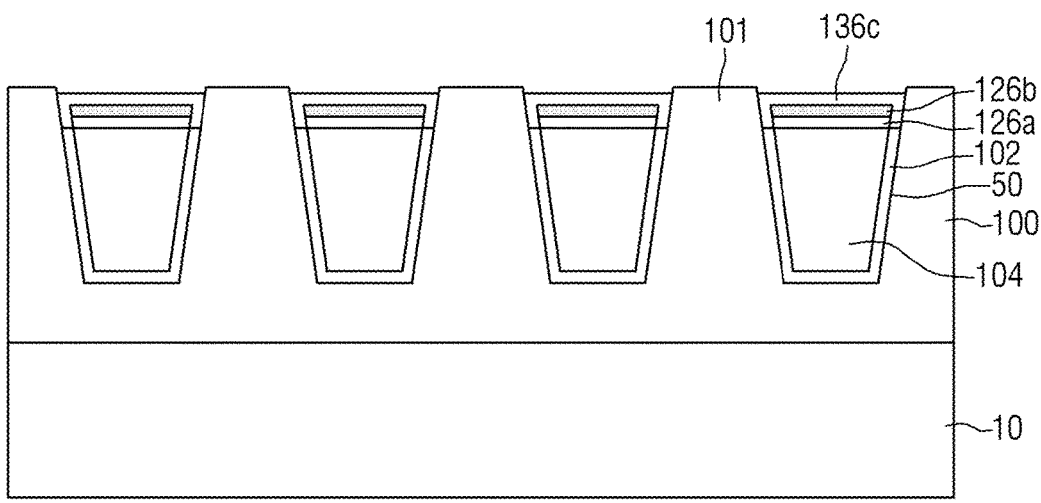

Referring to FIG. 22, the second portion 136b of the capping layer 136 may be selectively removed using a DHF strip process.

Thus, a third capping pattern 136c (e.g., AlN capping pattern) may be formed only on the second capping pattern 126b and the first barrier layer 102. The third capping pattern 136c may not be formed on the IMD part 101. The third capping pattern 136c may function as a protection layer to protect the interconnect layer 104 during an etching process which will be described in connection with FIG. 25.

Figure 23:
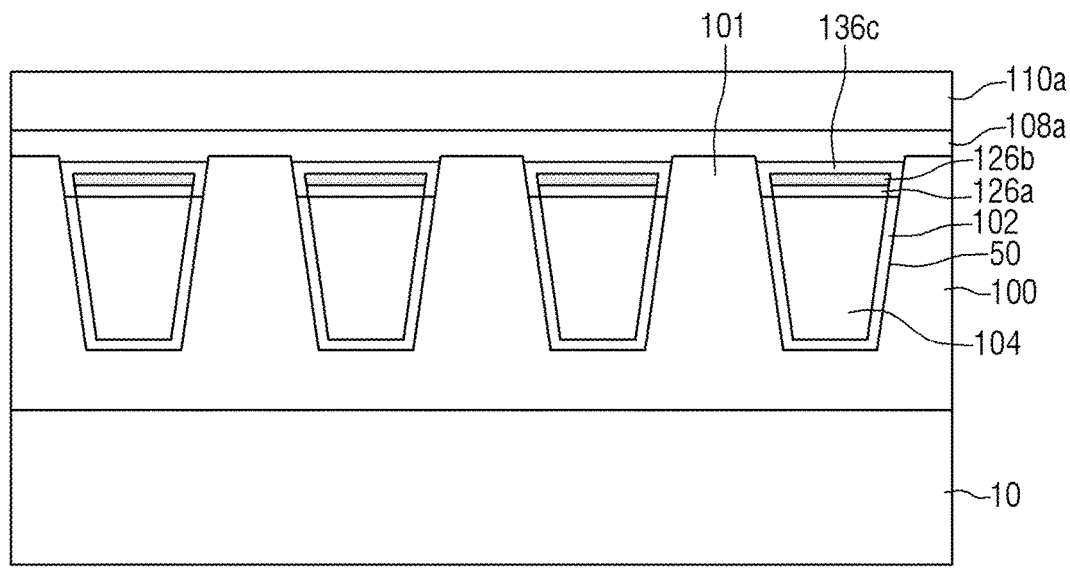
Figure 24:
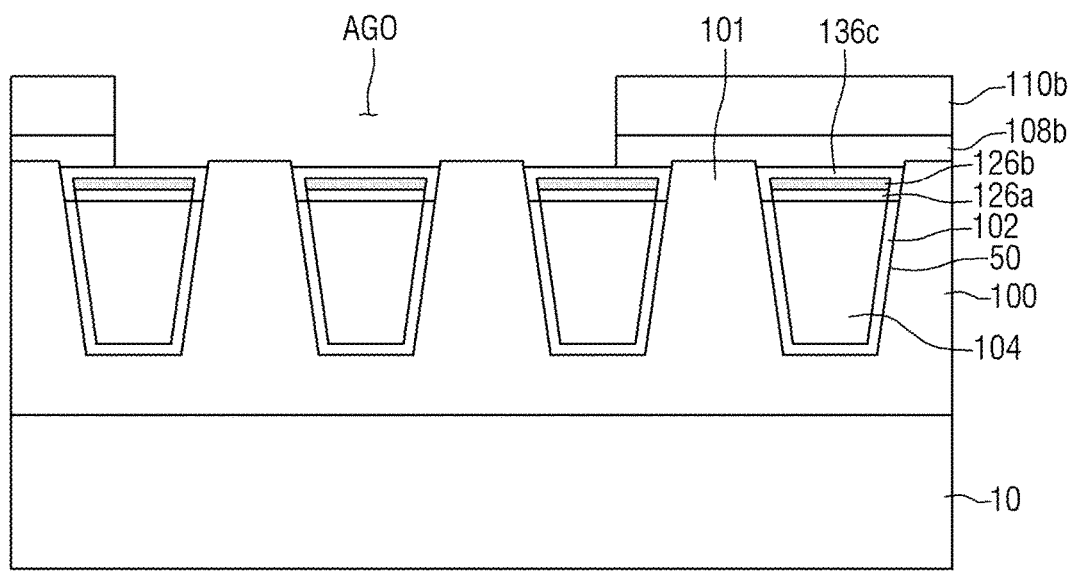

Referring to FIGS. 23 and 24, as described in FIGS. 5 and 6, the sacrificial mask pattern 108b and the hard mask pattern 110b which have the air gap region opening AGO may be formed. The air gap region opening AGO may expose at least a portion of the IMD part 101 and the third capping pattern 136c.

As illustrated in FIG. 23, the sacrificial mask layer 108a and the hard mask layer 110a may be formed on the substrate 10. Then, as illustrated in FIG. 24, the sacrificial mask layer 108a and the hard mask 110a may be partially removed to define the air gap region opening AGO.

The sacrificial mask layer 108a may include SiN, but not limited thereto. The hard mask layer 110a may include SiON, but not limited thereto.

Figure 25:
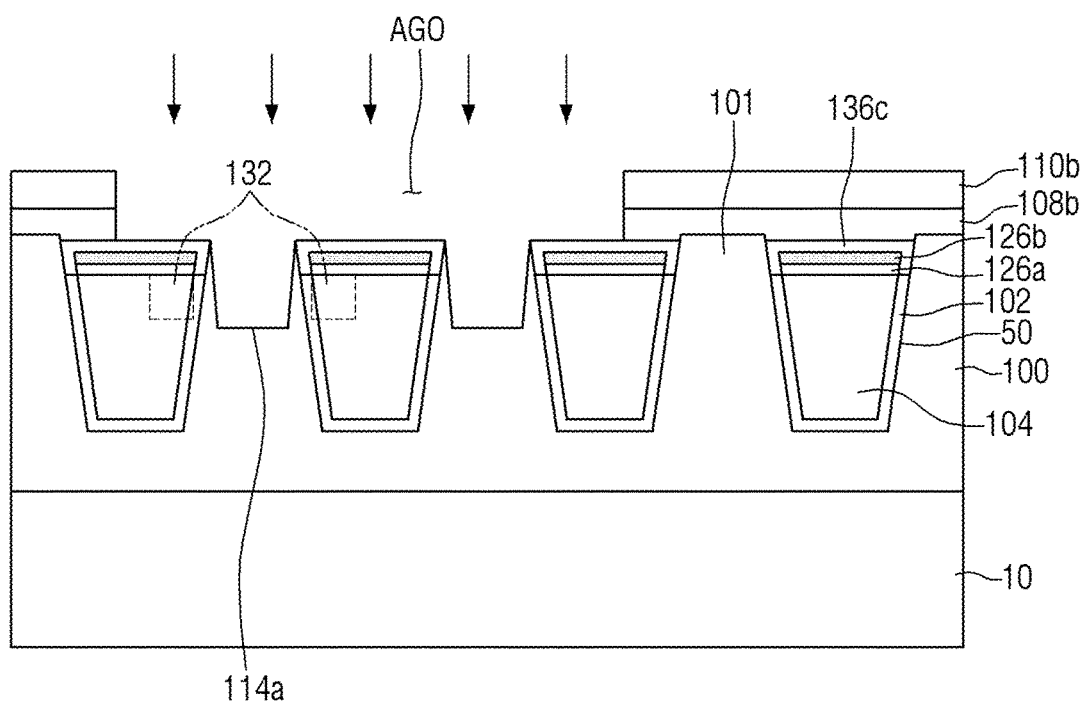

Referring to FIG. 25, a portion of the IMD part 101 exposed by the air gap region opening AGO may be etched by a first etching process.

The first etching process may include a dry etching process, e.g., an isotropic dry etching process. Due to a high etch selectivity between the second and third capping patterns 126b and 136c and the IMD part 101, a portion of the IMD part may be removed by the first etching process and the second and third capping patterns 126b and 136c may not be removed. The hard mask pattern 110b may be partially removed during the first etching process. In some embodiments, the hard mask pattern 110b may not be etched during the first etching process.

After the first etching process, the top surfaces of the interconnect layer 104 may be covered with the first through third capping patterns 126a, 126b, and 136c and may not be exposed. Thus, the interconnect layer 104 which are protected by the first through third capping patterns 126a, 126b, and 136c may not be etched by the first etching process.

When etching processes are performed, an edge portion 132 of the interconnect layer 104 may be protected from an etching damage by the first through third capping patterns 126a, 126b, and 136c, thus a loss of the interconnect layer (e.g., copper loss) may be prevented or reduced. The edge portion 132 may include a region in which an upper portion of the first barrier 102 contacts an upper portion of the interconnect layer 104. For example, an uppermost portion of the edge portion 132 may directly contact the first capping pattern 126a.

After the portion of the IMD part 101 is removed, the first air gap trench 114a may be formed.

Figure 26:
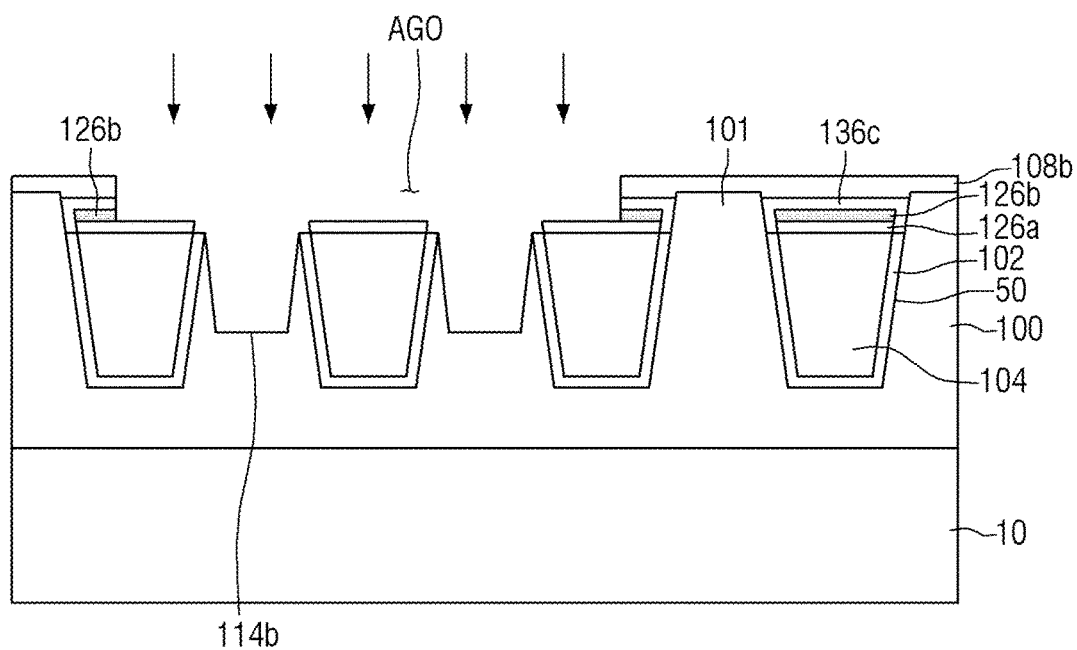

Referring to FIGS. 26, the IMD part in which the first air gap trench 114a is formed may be sequentially etched by a second etching process along with the second and third capping patterns 126b and 136c such that a second air gap trench 114b may be formed between the interconnect layers 104. The second air gap trench 114b may be deeper than the first air gap trench 114a. In some embodiments, the second air gap trench 114b may not be deeper than the interconnect layer 104.

The second etching process may include at least one of an EKC strip process, $NH_3$ RF plasma process, and a hydro fluoric acid strip process. The second etching process may include a first sub etching process and a second sub etching process.

For example, a wet etching process such as the EKC strip process may be performed as the first sub etching process of the second etching process so as to deeply etch the IMD part having the first air gap trench 114a and exposed by the air gap region opening AGO, thus the second air gap trench 114b of which a depth is greater than that of the first air gap trench 114a may be formed. By the wet etching process, a portion of the second and third capping patterns 126b and 136c may be removed. Further, the hard mask pattern 110b may be entirely removed and a portion of the sacrificial mask pattern 108b may be removed. In some embodiments, the second capping pattern 126b may not be removed.

The first capping pattern 126a (e.g., the Co capping pattern) may not be removed by the first sub etching process and may remain on the top surface of the interconnect layer 104. In this case, after an air gap structure is formed, the first capping pattern 126a may remain on the interconnect layer 104. In some embodiments, the first sub etching process may be performed using the $NH_3$ RF plasma process and the hydro fluoric acid strip process.

Then, as described in FIG. 18, the second sub etching process of the second etching process may be sequentially performed to form the third gap trench 114c.

For example, the second sub etching process using the $NH_3$ RF plasma process and the hydro fluoric acid strip process may be performed to deeply etch the IMD part 101 having the second air trench 114b, thus a third air gap trench 114c may be formed. By the $NH_3$ RF plasma process and the hydro fluoric acid strip process, the second capping pattern 126b and the sacrificial mask pattern 108b may be entirely removed. As result, the first capping pattern 126a (e.g., the Co capping pattern) may not be removed and remain on the interconnect layer 104. In some embodiments, the first capping pattern 126a may be removed by the second sub etching process to expose the top surface of the interconnect layer 104.

In some embodiments, the second sub etching process may be performed using the EKC strip process. In some embodiments, any one of the first sub etching process and the second sub etching process may be omitted.

According to example embodiments, since the second and third capping patterns 126b and 136c, the sacrificial pattern 108b, and the hard mask pattern 110b are removed by the etching processes as described above, an additional planarization process on the interconnect layer 104 and the IMD part 101 may not be performed. By the etching processes as described above, the planarization process may be performed. As a result, after the second etching process, a top surface of the IMD part 101 and a top surface of the interconnect layer 104 (or a top surface of the first capping pattern 126a) may be substantially coplanar.

As described in connection with FIG. 19, the second barrier layer 116 may be conformally formed on a sidewall and a bottom surface of the third air gap trench 114c on the top surface of the first capping pattern 126a (e.g., the Co capping pattern) and the top surface of the IMD part 101. The second barrier layer 116 may be formed of or include, e.g., SiCN, but not limited thereto.

Also, as described in connection with FIG. 11, the second dielectric layer 200 may be the second barrier layer 116. By forming the second dielectric layer 200 on the second barrier layer 116 not to fill the third air gap trench 114c, the air gap 118 may be formed in the IMD part 101 (or the third air gap trench 114c), and further an interconnection structure or an integrated circuit which has a stacked structure may be formed.

In the method of manufacturing the semiconductor device according to some example embodiments as described above, by recessing the interconnect layer 104 (e.g., copper interconnect layer) and forming at least one of the capping patterns 106c, 126a, 126b, 136c on the recessed interconnect layer 104, the interconnect layer 104 (e.g., the edge portion 132) may be protected from the etching damage by the at least one of the capping patterns 106c, 126a, 126b, and 136c while performing the etching processes on the IMD part 101. Therefore, the loss of the interconnect layer (e.g., copper loss) may be prevented or reduced.

Figure 27:
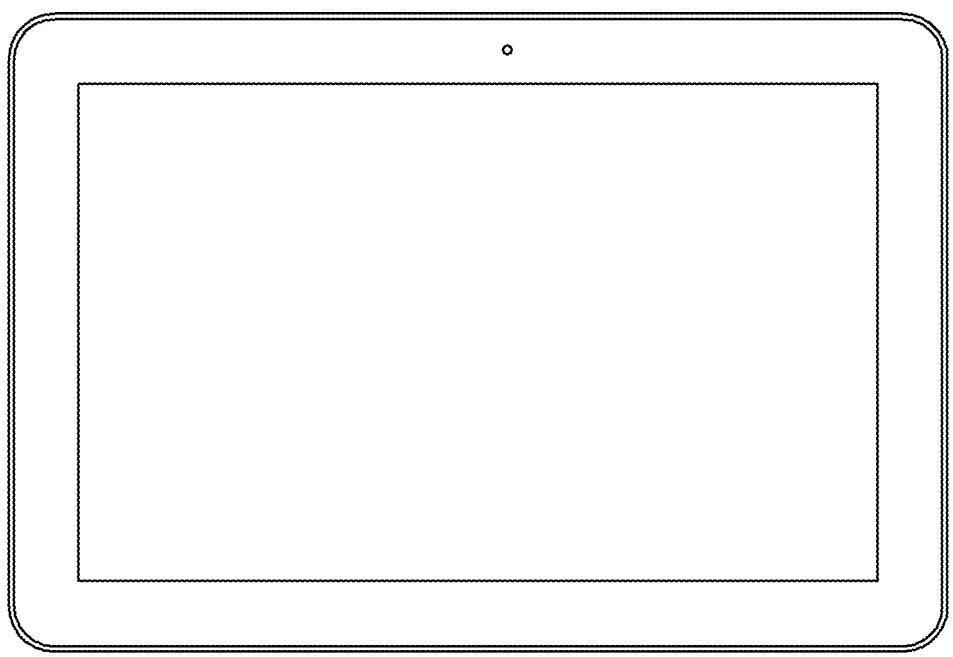
Figure 28:
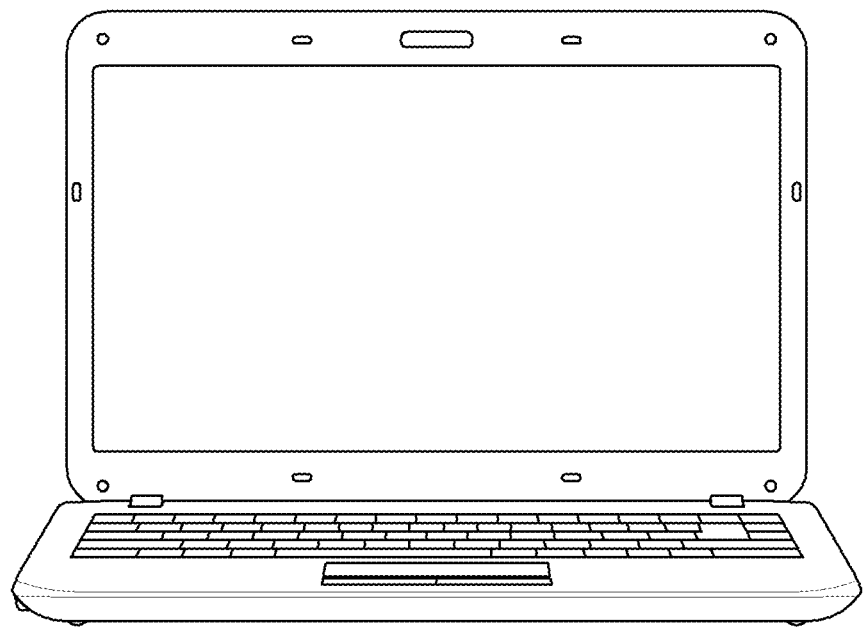
Figure 29:
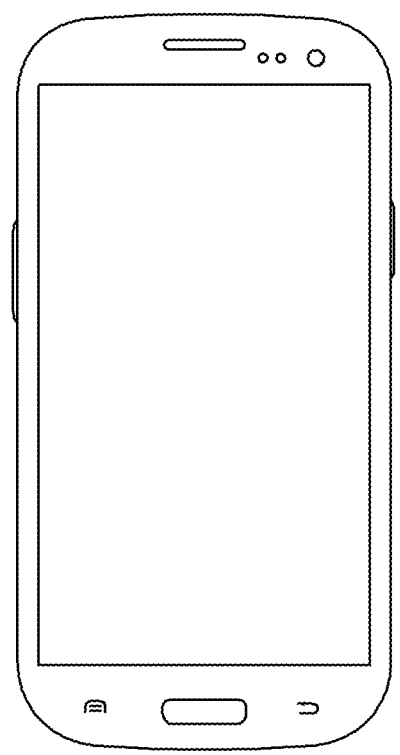

FIGS. 27 through 29 illustrate example electronic devices to which one or more semiconductor devices according to some example embodiments of the inventive concept can be employed.

FIG. 27 illustrates a tablet PC 1200, FIG. 28 illustrates a notebook computer 1300, and FIG. 29 illustrates a smart phone 1400. At least one of the semiconductor devices described herein according to some embodiments of the inventive concept may be used to form the tablet PC 1200, the notebook computer 1300, the smart phone 1400, and the like.

It is obvious to one skilled in the art that the semiconductor devices according to some embodiments of the inventive concept may also be applied to other IC devices not illustrated herein. In the above-described embodiments, only the tablet PC 1200, the notebook computer 1300 and the smart phone 1400 have been exemplified as the devices to which the semiconductor devices according to the embodiments of the inventive concept are applied, but aspects of the inventive concept are not limited thereto. In some embodiments of the inventive concept, the semiconductor device may be implemented as a computer, an ultra mobile personal computer (UMPC), a work station, a netbook, a personal digital assistant (PDA), a portable computer, a web tablet, a wireless phone, a mobile phone, a smart phone, an e-book, a portable multimedia player (PMP), a potable game console, a navigation device, a black box, a digital camera, a 3-dimensional (3D) television, a digital audio recorder, a digital audio player, a digital picture recorder, a digital picture player, a digital video recorder, a digital video player, or the like.

While the inventive concept has been particularly shown and described with reference to example embodiments thereof, it will be understood by those of ordinary skill in the art that various changes in form and details may be made therein without departing from the spirit and scope of the present disclosure as defined by the following claims.

What is claimed is:

1. A semiconductor device, comprising:
a first dielectric layer including grooves;
a first barrier layer in each of the grooves;
an interconnect layer on the first barrier layer to fill each of the grooves;
a first capping pattern on the interconnect layer, the first capping pattern including Co;
a second capping pattern extending along a top surface of the first capping pattern, the second capping pattern including CoSiN; and
an air gap between the grooves.

2. The semiconductor device according to claim 1, wherein the first capping pattern is formed on a top surface of the interconnect layer and is not formed on a top surface of the first barrier layer.

3. The semiconductor device according to claim 2, wherein the second capping pattern does not extend along the top surface of the first barrier layer.

4. The semiconductor device according to claim 1, wherein the second capping pattern is formed by a silicidation process and a nitrification process which are performed on the first capping pattern.

5. The semiconductor device according to claim 1, further comprising a third capping pattern on the second capping pattern, the third capping pattern including AlN.

6. The semiconductor device according to claim 5, wherein the third capping pattern extends along top surfaces of the second capping pattern and the first barrier layer.

7. The semiconductor device according to claim 1, wherein the first dielectric layer further includes an IMD part between the grooves, and
the first capping pattern being not formed on the IMD part.

8. The semiconductor device according to claim 7, further comprising a second barrier layer and a second dielectric layer,
wherein the IMD part includes an air gap trench between the grooves,
the second barrier layer is on a sidewall and a bottom surface of the air gap trench and on the interconnection layer,
the second dielectric layer is on the second barrier layer, and
the air gap is formed in the IMD part between the second dielectric layer and the second barrier layer.

9. The semiconductor device according to claim 1, wherein the air gap is formed in an air gap trench between the grooves and a bottom surface of the air gap trench is higher than a bottom surface of each of the grooves.

10. The semiconductor device according to claim 1, wherein the air gap is formed in an air gap trench between the grooves and a bottom surface of the air gap trench is lower than a bottom surface of each of the grooves.

11. A semiconductor device, comprising:
a first dielectric layer including grooves and an IMD part between the grooves;
a first barrier layer in each of the grooves;
an interconnect layer on the first barrier layer to fill each of the grooves;
a first capping pattern on the interconnect layer, the first capping pattern including Co and being not formed on the IMD part;
a second capping pattern on the first capping pattern, the second capping pattern including CoSiN and being not formed on the IMD part; and
an air gap in the IMD part between the grooves.

12. The semiconductor device according to claim 11, wherein the second capping pattern contacts the first capping pattern.

13. The semiconductor device according to claim 12, wherein the second capping pattern does not contact the interconnect layer and the first barrier layer.

14. The semiconductor device according to claim 11, further comprising a second barrier layer and a second dielectric layer,
wherein the IMD part includes an air gap trench between the grooves,
the second barrier layer is on a sidewall and a bottom surface of the air gap trench and on the interconnection layer,
the second dielectric layer is on the second barrier layer, and
the air gap is formed in the IMD part between the second dielectric layer and the second barrier layer.

15. The semiconductor device according to claim 14, a bottom surface of the air gap trench is higher than a bottom surface of each of the grooves.

16. A semiconductor device, comprising:
a dielectric layer including a first groove and a second groove;
a first interconnect layer filling the first groove and a second interconnect layer filling the second groove;
a first capping pattern on the first interconnect layer and the second interconnect layer, the first capping pattern including Co;
a second capping pattern on the second interconnect layer, the second capping pattern including CoSiN; and
an air gap beside the first groove.

17. The semiconductor device according to claim 16, wherein the second capping pattern is not formed on at least a portion of the first capping pattern on the first interconnect layer.

18. The semiconductor device according to claim 17, wherein the air gap is not formed between the first groove and the second groove.

19. The semiconductor device according to claim 16, further comprising barrier layer between the dielectric layer and the first interconnect layer and between the dielectric layer and the second interconnect layer.

20. The semiconductor device according to claim 16, wherein the air gap is formed in an air gap trench beside the first groove and a bottom surface of the air gap trench is higher than a bottom surface of each of the grooves.

* * * * *